United States Patent
Hung et al.

(10) Patent No.: US 11,734,181 B2
(45) Date of Patent: *Aug. 22, 2023

(54) CONTINUOUS READ WITH MULTIPLE READ COMMANDS

(71) Applicant: MACRONIX INTERNATIONAL CO., LTD., Hsinchu (TW)

(72) Inventors: Shuo-Nan Hung, Hsinchu (TW); Chun-Lien Su, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/579,428

(22) Filed: Jan. 19, 2022

(65) Prior Publication Data

US 2022/0138109 A1    May 5, 2022

Related U.S. Application Data

(63) Continuation of application No. 17/061,451, filed on Oct. 1, 2020, now Pat. No. 11,249,913.

(60) Provisional application No. 62/985,898, filed on Mar. 6, 2020.

(51) Int. Cl.
*G06F 12/08* (2016.01)
*G06F 12/0882* (2016.01)

(52) U.S. Cl.
CPC .. *G06F 12/0882* (2013.01); *G06F 2212/1024* (2013.01); *G06F 2212/2022* (2013.01)

(58) Field of Classification Search
CPC ......... G06F 12/0882; G06F 2212/2022; G06F 2212/1024

USPC .......................................................... 711/103
See application file for complete search history.

(56) References Cited

U.S. PATENT DOCUMENTS

| 5,768,215 | A  | 6/1998 | Kwon et al. |
| 6,615,307 | B1 | 9/2003 | Roohparvar |
| 7,423,915 | B2 | 9/2008 | Leong et al. |
| 7,644,224 | B2 | 1/2010 | Murin et al. |

(Continued)

FOREIGN PATENT DOCUMENTS

| CN | 104425014 A | 3/2015 |
| CN | 103871447 B | 3/2017 |

(Continued)

OTHER PUBLICATIONS

U.S. Office Action in U.S. Appl. No. 17/321,193 dated Jul. 14, 2022, 21 pages.

(Continued)

*Primary Examiner* — Hua J Song
(74) *Attorney, Agent, or Firm* — Paul Durdik; Haynes Beffel & Wolfeld LLP

(57) ABSTRACT

A memory device includes a data register operatively coupled to the memory array, a cache operatively coupled to the data register, and an input/output interface operatively coupled to the cache. A controller executes a continuous page read operation to sequentially load pages to the data register and move the pages to the cache, in response to a page read command, executes the cache read operation in response to a cache read command to move data from the cache to the input/output interface, and to stall moving of the data from the cache until a next cache read command, and terminates the continuous page read operation in response to a terminate command.

19 Claims, 13 Drawing Sheets

(56) References Cited

U.S. PATENT DOCUMENTS

| | | |
|---|---|---|
| 8,261,008 B2 | 9/2012 | Que |
| 8,358,558 B2 | 1/2013 | Lee et al. |
| 8,375,273 B2 | 2/2013 | Hara |
| 8,705,293 B2 | 4/2014 | She et al. |
| 8,902,668 B1 | 12/2014 | Dutta et al. |
| 9,009,566 B2 | 4/2015 | Hung et al. |
| 9,053,762 B2 | 6/2015 | Hirobe |
| 9,136,006 B2 | 9/2015 | Hung et al. |
| 9,349,469 B2 | 5/2016 | Chen et al. |
| 9,411,521 B2 | 8/2016 | Lu et al. |
| 9,483,348 B2 | 11/2016 | Yun |
| 9,536,601 B2 | 1/2017 | Chen et al. |
| 9,552,882 B2 | 1/2017 | Tseng et al. |
| 9,690,650 B2 | 6/2017 | Liu et al. |
| 9,971,647 B2 | 5/2018 | Michael |
| 10,957,384 B1 | 3/2021 | Hung et al. |
| 11,048,649 B2 | 6/2021 | Hung |
| 11,249,913 B2 | 2/2022 | Hung et al. |
| 2003/0093744 A1 | 5/2003 | Leung et al. |
| 2004/0109358 A1 | 6/2004 | Roohparvar et al. |
| 2006/0146607 A1 | 7/2006 | Hosono et al. |
| 2009/0168530 A1 | 7/2009 | Yamamura et al. |
| 2011/0063748 A1 | 3/2011 | Song et al. |
| 2013/0145093 A1 | 6/2013 | Kaminaga et al. |
| 2013/0286752 A1 | 10/2013 | Michioka et al. |
| 2013/0346671 A1 | 12/2013 | Michael et al. |
| 2014/0258811 A1 | 9/2014 | Liu et al. |
| 2015/0255167 A1 | 9/2015 | Gillingham et al. |
| 2016/0034346 A1 | 2/2016 | Michael |
| 2016/0372184 A1 | 12/2016 | Shalvi et al. |
| 2017/0185353 A1 | 6/2017 | Intrater et al. |
| 2018/0088867 A1 | 3/2018 | Kaminaga et al. |
| 2018/0090202 A1 | 3/2018 | Kaminaga et al. |
| 2018/0143908 A1 | 5/2018 | Zhang et al. |
| 2019/0196972 A1 | 6/2019 | Benisty et al. |
| 2019/0340125 A1* | 11/2019 | Mondello ........... G06F 11/1068 |
| 2020/0125443 A1 | 4/2020 | Hung et al. |
| 2020/0142843 A1 | 5/2020 | Hung |
| 2021/0279172 A1 | 9/2021 | Hung et al. |

FOREIGN PATENT DOCUMENTS

| | | |
|---|---|---|
| JP | 2003529883 A | 10/2003 |
| JP | 2009158015 A | 7/2009 |
| JP | 2013118031 A | 6/2013 |
| TW | 201324516 A | 6/2013 |
| TW | 201421238 A | 6/2014 |
| TW | 201830404 A | 8/2018 |
| WO | 0175896 A2 | 10/2001 |

OTHER PUBLICATIONS

Winbond "W25Q128FV Data Sheet"—May 13, 2016, 99 pages.

"3V, 2G/4G-bit NAND Flash Memory, MX30LFx4G18AC", Macronix International Co., Ltd., http://www.macronix.com, Revision 1.4, Jan. 20, 2017, 80 pages.

Macronix International Co., Ltd. Technical Note, "Improving NAND Throughput with Two-Plane and Cache Operations," Rev. 1, Nov. 15, 2013, 13 pages.

Micron Technology, Inc. Technical Note "NAND Flash 101: An Introduction to NAND Flash and How to Design it in to Your Next Product," TN-29-19, Rev. B, at least as early as Dec. 2006, 27 pages.

Micron Technology, Inc. Technical Note "NAND Flash Performance Increase Using the Micron Page Read Cache MODE Command," TN-29-01, at least as early as Dec. 2004, 10 pages.

U.S. Appl. No. 16/581,562, filed Sep. 24, 2019, 34 pages.

* cited by examiner

CONTINUOUS READ WITH MULTIPLE READ COMMANDS

PRIORITY APPLICATION

This application is a continuation of U.S. patent application Ser. No. 17/061,451 filed 1 Oct. 2020 (now U.S. Pat. 11,249,913), which application claims the benefit of U.S. Provisional Patent Application No. 62/985,898 filed 6 Mar. 2020; which applications are incorporated herein by reference.

BACKGROUND

Field

The present invention relates to integrated circuit memory devices, such as NAND flash devices, that support continuous read operations, and particularly continuous page read operations.

Description of Related Art

One type of read latency is the time between receiving a read command and the time at which data requested by the read command is available at the output. This type of latency can be relatively long in NAND flash devices. As a result, NAND flash can be considerably slower than other types of memory, such as NOR flash, for some operations.

Command sequences known as cache read and as continuous read have been developed to address this latency for NAND flash devices. In a continuous read command sequence, NAND flash devices have been configured to output sequential pages, so that the sequential pages are available with less delay between the pages. Continuous read operations for NAND flash can include three basic phases in operations by the host, as follows:

(1) Start phase: the host needs to issue a page read (C1) command to read out the data of the new page address to the cache. It takes a read latency tR to read out the page data.

(2) Sequential Continuous read phase: the host reads out the data in the cache from the interface on the memory device continuously in this phase.

(3) End phase: Depending on the read protocol, the host either needs to issue "end" (C3) command (some common NAND Flash devices) or raises a chip select signal from 0 to 1 (SPI NAND Flash devices) to terminate the sequential continuous read operation.

In some systems, a host device is connected to a continuous read memory device. The host device may receive the flow of data at an interface buffer, and then transfer the data from the interface buffer to internal memory. The rate at which the flow of data can be received is limited in the host by the size of the interface buffer, and the availability of the internal memory to receive the data.

Thus, it is desirable to provide a technology to control the flow of data in a continuous read operation under control of the receiving device.

SUMMARY

A technology is described supporting flexible continuous read operations.

A memory device is described that comprises a memory array, such as a NAND flash array, a data register operatively coupled to the memory array, and a cache operatively coupled to the data register. An input/output interface is operatively coupled to the cache, and provides access to an external host. The controller on the memory device is responsive to commands and addresses received at the input/output interface, and includes circuits to control memory operations including i) a continuous read operation to output a stream of data segments (such as pages) from the memory array to the data register, and from the data register to the cache, and ii) a cache read operation to output data from the cache to the input/output interface connected to the host. The cache read operation can execute at a throughput controlled by the host, during execution of the continuous read operation at a throughput which can be decoupled from that of the cache read operation.

The controller on the memory device can execute, in response to a read command, the continuous read operation to load data segments from the memory array to the data register and move data segments to the cache as the cache becomes available. Also, the controller executes a cache read operation in response to a cache read command to move data from the cache to the input/output interface, and to stall moving of data from the cache until the next cache read command. The controller may also terminate the continuous page read operation in response to a terminate command or toggling of a control signal.

Note that in places in which the present description refers to a "page" or to "pages," which includes a data segment having a size determined by the parallel input and output path between a memory array and a data register in a page buffer. It is understood that data segments of different sizes can be used in various embodiments for data transfers through the data register and the cache.

For the purposes of the current description a "command" comprises an op code such as a preset byte, a combination of bytes, or other parameter, that is decoded by the receiving memory device to identify an operation to be performed.

In various embodiments, the cache read command can carry a cache address and, in some examples, so that data read by the host may be randomly selected (non-sequential) within the cache memory on the memory device. Also, the cache read command can carry both a cache address for selecting data to read from the cache and a page address for selecting a page to be read from the array to the data register, so that data read by the host may be non-sequential within the cache memory on the memory device, and a next page to be moved from the array to the data register may be non-sequential within the array. In this manner, the controller executes a random continuous page read mode where, for the pages output in the continuous read mode, have random addresses in the sense that the page addresses of pages in the array to be read are not constrained to follow a preceding page address in the sequence.

The technology described herein provides a method for operating a memory device. The method includes executing a continuous page read operation to sequentially load pages to a data register and move pages from the data register to the cache, in response to a page read command. Also, the method includes executing a cache read operation to move data from the cache to the input/output interface on the device in response to a current cache read command and stalling movement of data from the cache to the input/output interface until a next cache read command in the sequence. Also, the method includes terminating the continuous page read operation in response to a terminate command or control signal.

The technology described includes methods for reading a file from a memory device. For example, the method includes issuing a page read command to initiate a continuous page read operation on the memory device to sequentially load pages of the file to the cache. Also, the method includes issuing a current cache read command and reading data from the cache, loading data in a buffer at the host or requesting device, and stalling movement of data from the cache to the buffer until a next cache read command, and then issuing a next cache read command in dependence on availability of memory space in the buffer, and continuing to issue cache read commands in a sequence to read the file. The method includes issuing a terminate command to stop the continuous page read operation on the memory device. In various embodiments, the cache read commands can include addresses including cache addresses and/or page addresses to allow for random access of data in the file during the reading operation.

According to embodiments described herein, a host device can issue multiple cache read commands during a continuous read operation in order to manage the flow of data as required by availability of resources on the host. In embodiments described, a termination command is added, in response to which the controller on the memory device terminates the continuous read operation. The termination command can be a command that causes abort of the continuous read operation, or a command that signals beginning of a different operation, such as an erase operation for flash memory. Multiple cache read commands are allowed before the termination command.

Other aspects and advantages of the present technology can be seen on review of the drawings, the detailed description and the claims, which follow.

DETAILED DESCRIPTION

A detailed description of embodiments of the present invention is provided with reference to the FIGS. 1-17.

Figure 1:
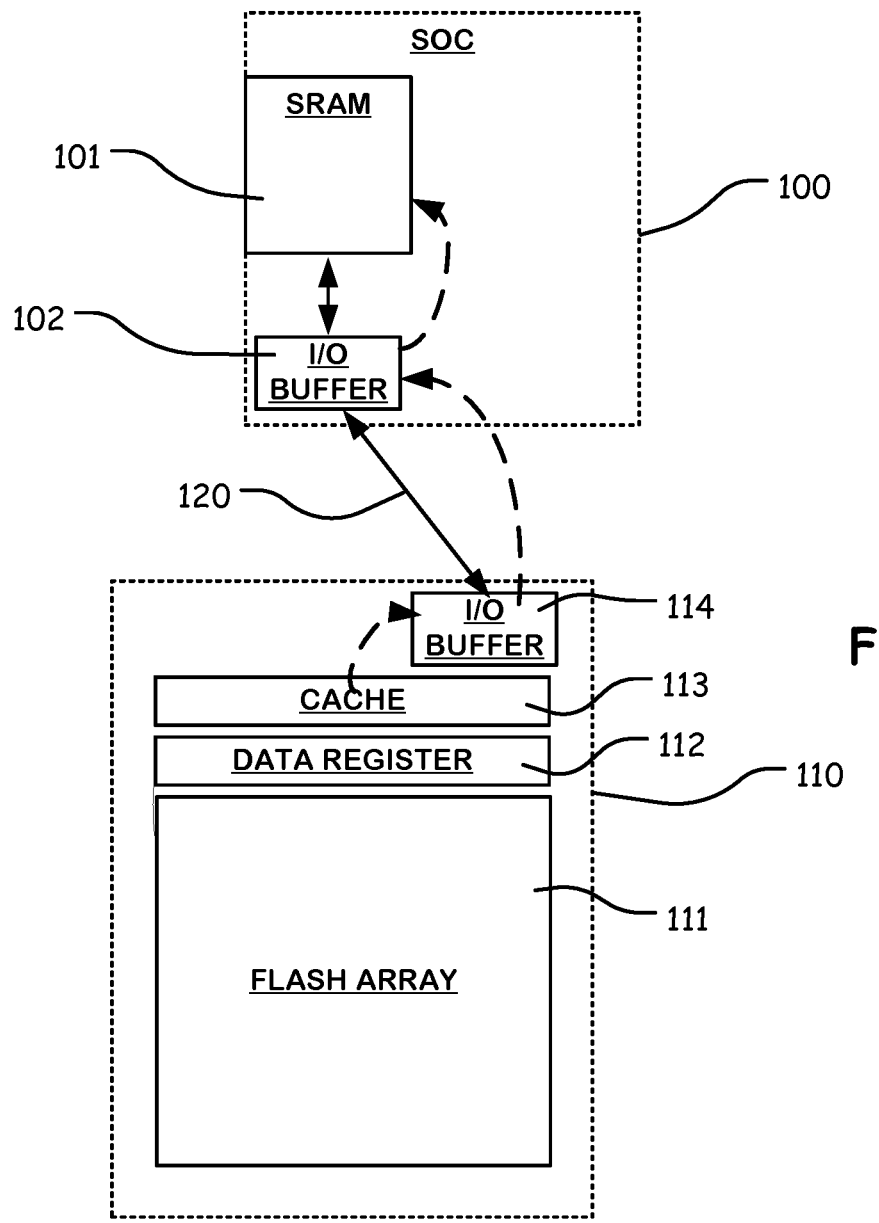
FIG. 1 is a simplified block diagram of a system including a host device and a flash memory supporting continuous read operations as described herein.

FIG. 1 illustrates a system including a host device 100, such as a so-called system-on-a-chip SOC device, and a flash memory device 110. The host device 100 and the flash memory device 110 are operatively coupled by a data link 120, such as a wired or wireless bus for transferring commands, data, addresses and status information.

The host device 100 includes on-chip memory, such as on-chip SRAM 101 for holding working data and files in use by functions of the host device 100. Also, the host device 100 includes an input/output (I/O) buffer 102 on an interface to the data link 120.

The memory device 110 in this example includes a flash array 111, such as a NAND flash array. The memory device 110 includes an input/output buffer 114 on an interface to the data link 120, and is used for transferring data across the link 120 to the corresponding input/output (I/O) buffer 102 on the host device 100. The memory device 110 includes a data register 112 which is connected to the NAND flash array to receive segments (e.g., pages) of data from the NAND flash array during a read operation. A cache 113 is connected to the data register 112, and provides a data path that buffers operations between the flash array 111, data register 112 and an input/output buffer 114.

In a read operation, data flows from the cache 113 to the I/O buffer 114 on the memory device 110, and across the link 120 to the I/O buffer 102 on the host device 100. Data is moved from the I/O buffer 102 to the on-chip SRAM 101 in this example. The I/O buffer 102 can be relatively small holding for example 16 bytes to 128 bytes in some embodiments. The on-chip SRAM 101 can be much larger, holding megabytes of data or more. Thus, the size of the I/O buffer 102 limits the amount of data that can be transferred across the link 120 in response to a given read operation. When the host device 100 reads a relatively large file, multiple read operations are executed to load one segment of data, and multiple segments of data are needed to complete the file, as illustrated in FIG. 2.

The read operation speed can be limited by the time required to move data from the I/O buffer 102 on the host device 100 to the on-chip SRAM 101, because of arbitration for access to the on-chip SRAM 101, or other on-chip resources, the speed of connections between the on-chip SRAM 101 and the I/O buffer 102, and for other reasons. Accordingly, the memory device 110 as described herein includes logic for execution of a command protocol allowing the host device 100 flexible control of the read transfer, including flexible control of automatic continuous read operations executed under control of a state machine on the memory device.

Figure 2:
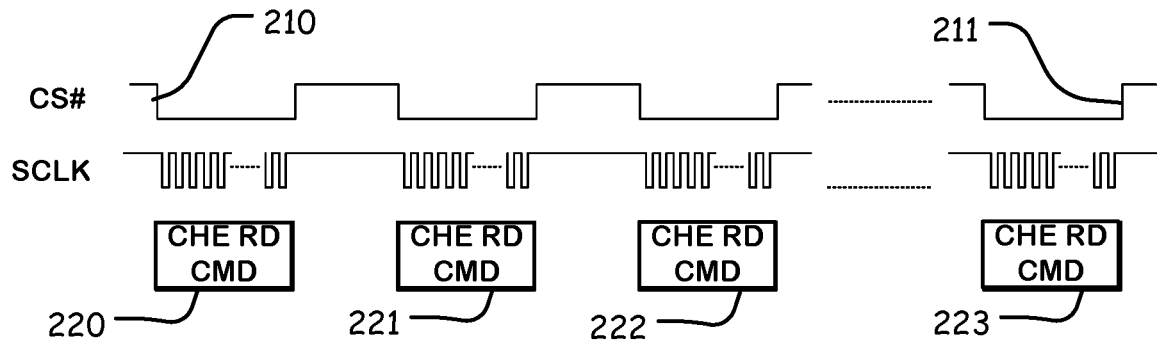
FIG. 2 illustrates a typical read waveform for a system like that of FIG. 1.

FIG. 2 illustrates an example of a read waveform on the link 120. As mentioned above, to read a relatively large file, the host device 100 issues a sequence of read commands. In a typical read, a page of data is moved to the cache 113 in response to the first command, and then the host issues a sequence of cache read commands 220, 221, 222, 223. In the example, a chip select signal CS # (active low) is toggled high to low at time 210 and a clock signal SCLK is turned on (started). Synchronized with the clock signal SCLK, the cache read command is received at the input of the memory device 110 followed by output of data from the cache. Data is read from the cache until the clock signal SCLK is stopped, and the chip select signal toggles from low to high. Each of the cache read commands is used to retrieve a portion of the data in the cache, the size and timing of which can be set by the host so as to avoid overrun of the I/O buffer 102 on the host. The read of the data in the cache that is desired by the host is completed when the last cache read command 223 completes and the chip select signal toggles at time 211 back from low to high.

This command protocol is useful for a read algorithm that accesses one segment in the cache at a time. For a large file, this protocol is repeated for the next segment. However, for a continuous page read mode where the memory device provides automatic page accesses to keep the cache full, greater data throughput can be achieved. A memory device configured for a continuous page read mode can have a structure like that shown in FIG. 3. Example continuous page read mode command protocols are described in our co-pending U.S. patent application Ser. No. 16/544,055, filed on 19 Aug. 2019, U.S. patent application Ser. No. 16/533,463, filed on 6 Aug. 2019, and U.S. patent application Ser. No. 16/581,562 filed on 24 Sep. 2019, which are incorporated by reference as if fully set forth herein.

Figure 3:
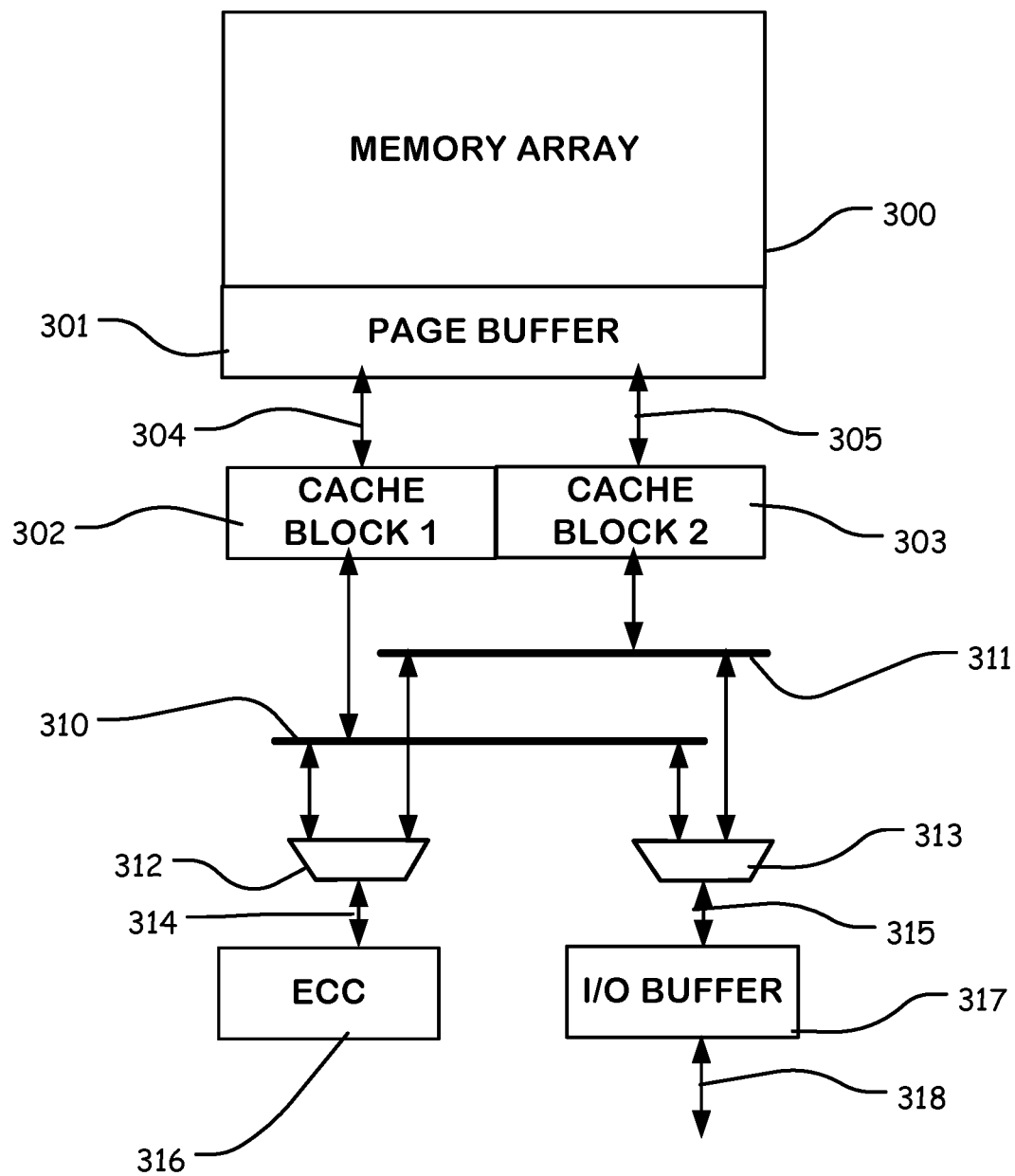
FIG. 3 is a simplified block diagram of a memory device architecture supporting a continuous page read mode.

FIG. 3 is a block diagram illustrating a memory array and data path circuitry including ECC circuits operable for continuous page read with two-level buffering (page buffer/cache BLOCK 1, cache BLOCK 2). This is one example of a circuit organization that can be utilized for example in the integrated circuit memory device 110 shown in FIG. 1.

In FIG. 3, a memory array 300, such as a NAND flash array, is coupled to a page buffer 301, which includes a data register for holding data read in segments, where a segment can be a page or other unit of data, from the memory array 300. Data can move from the memory array 300 to the page buffer 301 in parallel during a single page read operation. The page buffer 301 is coupled to data path circuits including a cache including cache BLOCK 1 302, and cache BLOCK 2 303 by bus 304 and bus 305, respectively. The bus 304 can have a data width that is half the width+ECCs of the page buffer 301, for transfer of one half of a page, or other segment size, from the page buffer 301 to cache BLOCK 1, in a single cycle. Likewise, the bus 305 can have a data width that is half the width of the page buffer 301, for transfer of one half of the page from the page buffer 301 to cache BLOCK 2, in a single cycle. ECC bytes can be included in the cache BLOCK 1 and cache BLOCK 2, or additional memory elements can be used for ECC bytes in parallel with cache BLOCK 1 and cache BLOCK 2.

Cache BLOCK 1 and cache BLOCK 2 are in advantageous embodiments configured to hold at least one ECC chunk, including the data and ECC code associated with the data so that it can be operated on by ECC circuits 316 independently of data in the other buffer.

As illustrated, the data path circuits include a bus 310 connected to cache BLOCK 1, and a bus 311 connected to cache BLOCK 2. The bus 310 is connected to a multiplexer 312 and to a multiplexer 313. Likewise, the bus 311 is connected to the multiplexer 312 and to the multiplexer 313. The output of the multiplexer 312 is connected by link 314 to the ECC circuits 316. The output of the multiplexer 313 is connected by link 315 to the I/O interface 317 (including an I/O buffer), which provides the output data for the addressed pages. Data can be moved on the bus 310 and the bus 311 by addressable units such as bytes or words that are supportable by the buses 310, 311, for use by the ECC circuits 316 and for output by the interface 317 on I/O ports 318.

Figure 4:
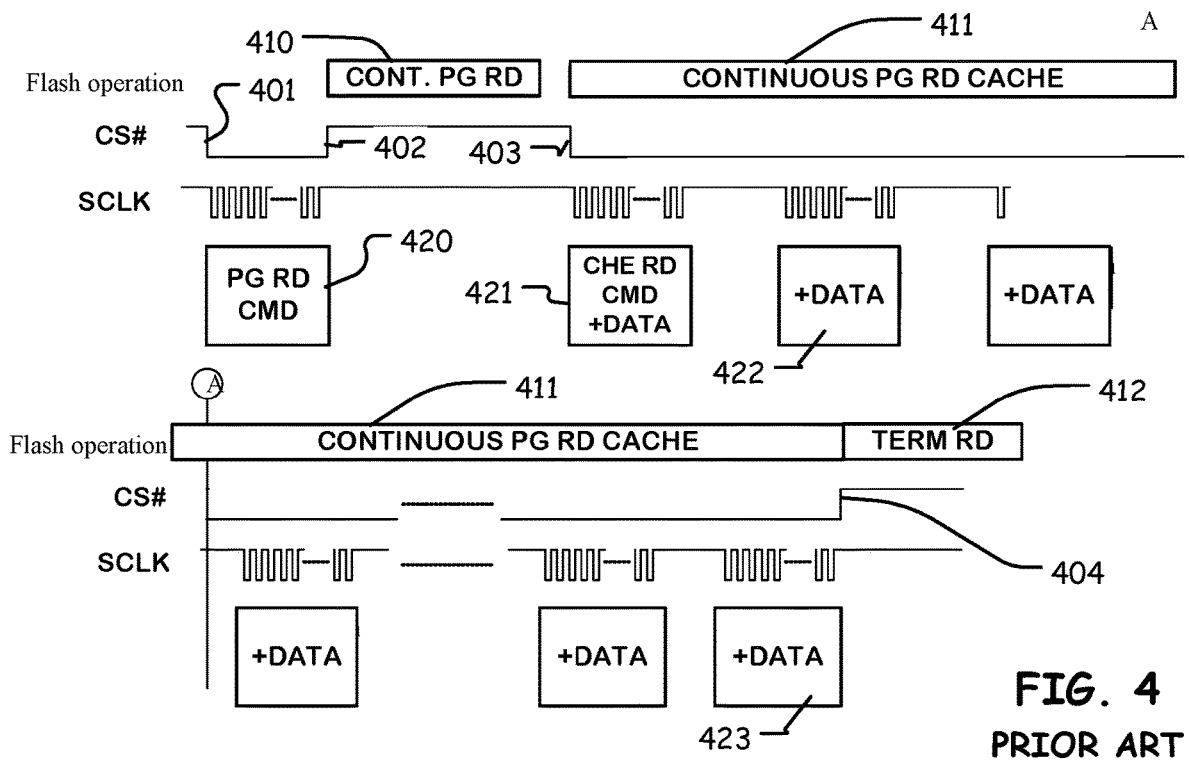
FIG. 4 illustrates a read waveform for a continuous page read mode according to prior art.

FIG. 4 illustrates a prior art command protocol supporting a continuous page read mode. According to this protocol, the host issues a page read command 420 in coordination with toggling of the chip select signal at time 401, and starting of the clock signal until toggling of the chip select signal at time 402. The controller on the memory device executes a continuous page read operation 410, loading a page identified by the page read command into the data register of the page buffer and from there into the cache memory. After a delay to account for latency of moving data from the array to the cache memory, the host issues a cache read command 421 on toggling of the chip select signal at time 403, and starting of the clock signal. The continuous page read operation 411 continues to move pages of data in sequence out of the memory array to the data register, and from the data register to the cache memory to support continuous output of data. This continuous page read operation 411 can be stalled by stopping the clock or by other control operations so as to not overrun the cache memory. The host receives data from the cache having a length that is determined by a number of clock signals, such as the number of clock signals in the data output phase of the cache read command, where the end of the data output phase can be controlled by stopping the clock. Then, to receive a next data unit from the cache, the host again starts the clock (422) to receive a unit of data having a length determined by the number of clock signals in the interval without issuing a command. This cycle continues until the end of the continuous page read operation. According to this protocol, the last data unit is read (423) and on completion of the read of the last data unit the clock is stopped and the chip select signal is toggled at time 404. Because the controller continuously updates the data from the memory to the cache, the host must indicate to the memory device when to terminate the continuous page read operation, in this example by toggling the chip select signal. In response to the toggling of the chip select signal, the controller terminates (412) the continuous page read operation. The controller then waits for a next command.

The command protocol of FIG. 4 requires the host device to execute three different types of operations for a continuous page cache read. The three operations include the cache read command 421 which accompanies receiving data from the cache, the read only intervals (e.g. 422) in which data is received from the cache by toggling the clock signal, and the read only interval 423 coinciding with toggling the chip select signal at time 404 to signal termination of the continuous page read operation. Because of the different types of operations required, programming of a continuous page read mode in a host device is error-prone, and inefficient.

Figure 5:
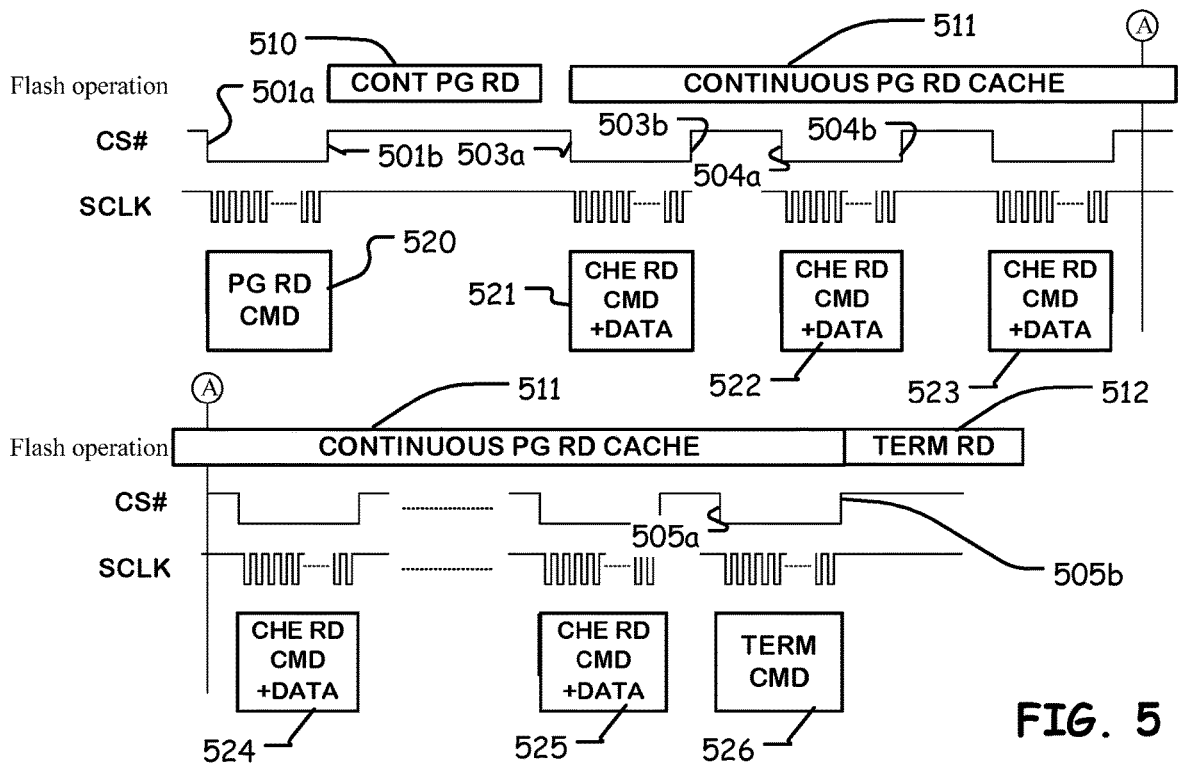
FIG. 5 illustrates a read waveform for a continuous page read mode with multiple cache read commands.

FIG. 5 illustrates a command protocol for continuous page read mode operations providing the host device greater flexibility, requiring a single type of operation (i.e. a command-based operation) for each transfer of data. According to this protocol, the host issues a page read command 520 in coordination with toggling of the chip select signal at time 501a, and starting of the clock signal until toggling of the chip select signal at time 501b. The controller on the memory device executes a continuous page read operation 510, loading a page identified by the page read command into the data register of the page buffer and from there into the cache memory. After a delay to account for latency of moving data from the array to the cache memory, the host issues a cache read command 521 on toggling of the chip select signal at time 503*a,* and starting of the clock signal. The unit of data is read from the cache to the host having a length that is determined by the number of clock signals in the data output phase of the cache read command sequence between the toggling of the chip select signal at time 503*a* and time 503*b*. In the background under control of on-chip control logic such as a state machine, the continuous page read operation 511 continues to move data out of the memory array into the cache memory through the data register. When the host is ready to receive a next unit of data, a next cache read command 522 is provided between the toggling of the chip select signal at times 504*a* and time 504*b*. The host issues cache read commands 523, 524, 525 in sequence having a timing controlled by the host, and reading units of data from the cache having respective sizes controlled by the host, such as by starting and stopping the clock, so as to avoid overrun of the input/output buffer on the host. To read a last data unit, in this example, the host issues a terminate command 526 for the continuous page read operation in coordination with toggling of the chip select signal. The terminate command 526 may be a command just to terminate the continuous read operation or a command to abort the continuous read operation and start a new operation such as program, erase or another page read operation. When the chip select signal toggles at time 505*b,* the controller terminates (512) the continuous page read operation. Cache read commands 521, 522, 523, 524, 525 may include a page address, such used in support of random page continuous read operations by the on-chip logic.

Accordingly, the command-based protocol of FIG. 5 requires the host device, after initiating the continuous page read operation, to issue a single type of operation, including a cache read command, for each unit of data received from the memory device with toggling of the chip select signal and starting and stopping of the clock. This protocol is simpler to implement at the host device, and less error-prone.

Figure 6:
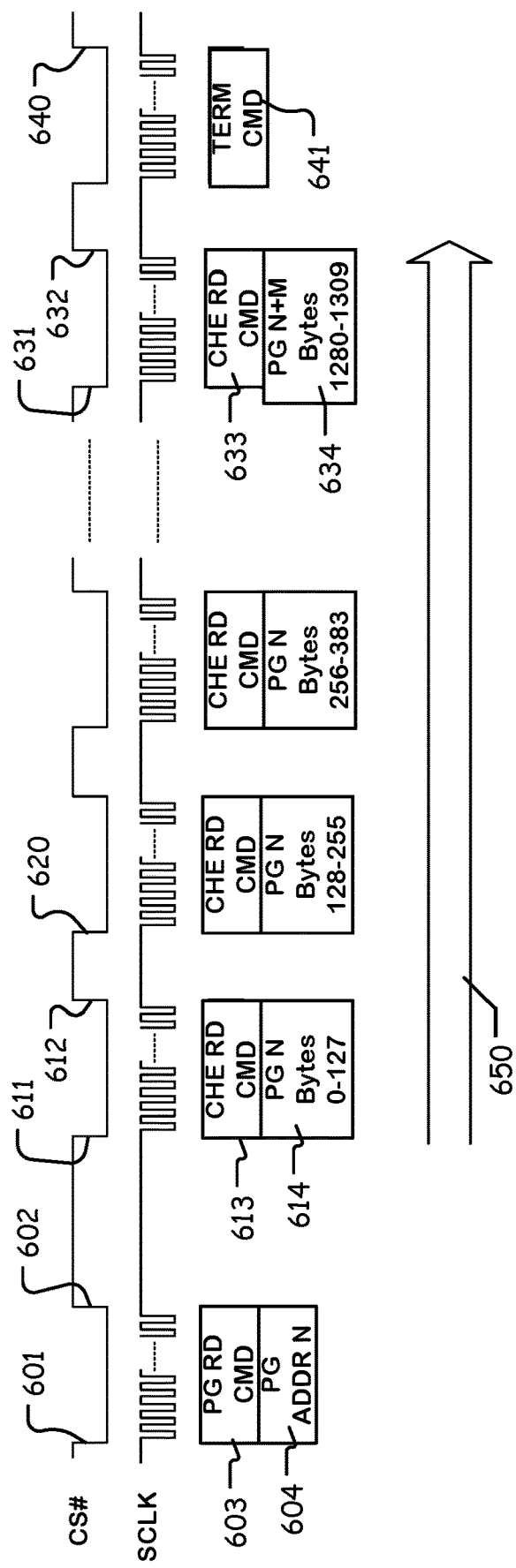
FIG. 6 illustrates a read waveform for a continuous page read mode of a file including multiple pages.

FIG. 6 illustrates another example of a continuous page read mode using multiple cache read commands. According to this protocol, the host issues a page read command 603 with a starting page address 604, in coordination with toggling of the chip select signal at time 601 and 602, and starting of the clock signal until toggling of the chip select signal at time 602. The controller on the memory device executes a continuous page read operation, loading the page identified by the starting page address 604 and continuing to load following pages into the data register of the page buffer and from there into the cache memory until the operation is terminated. After a delay to account for latency of moving data of the starting page from the array to the cache memory, the host issues a cache read command 613 on toggling of the chip select signal at time 611, and starting of the clock signal. The unit of data is read including bytes 0-127 (614) is this example, moving from the cache to the host, where the 128 byte length can be determined by the number of clock signals in the data output phase between the toggling of the chip select signal at time 611 and time 612. In the background, the continuous page read operation continues to move data out of the memory array into the cache memory through the data register. When the host is ready to receive a next unit of data, a next cache read command is provided between the toggling of the chip select signal. The host issues cache read commands in sequence 650 until a last cache read command 633, in which for example bytes 1280-1309 (634) of the file are read to the host. In this example, there are no addresses included with the cache read commands, and the host will receive data in sequence from byte 0 of the first page to the end of the file. The sequence 650 can continue for any number of pages (i.e. to page N+M), to read a long file to the host. The timing of the cache read command and the lengths of the data units read with each cache read command can be controlled by the host so as to avoid overrun of the input/output buffer on the host. In this example, the segment of a page may have a length of 1024 bytes, and the last data unit read to the host may be in a second page output in the continuous page read operation at bytes 1280-1309. To terminate the continuous page read operation in the background, in this example, the host issues a terminate command 641 for the continuous page read operation in coordination with toggling of the chip select signal. In this example, no data unit is received in coordination with a terminate command 641. When the chip select signal toggles at time 640 in coordination with the terminate command, the controller terminates the continuous page read operation that had been moving data from the array to the cache.

Figure 7:
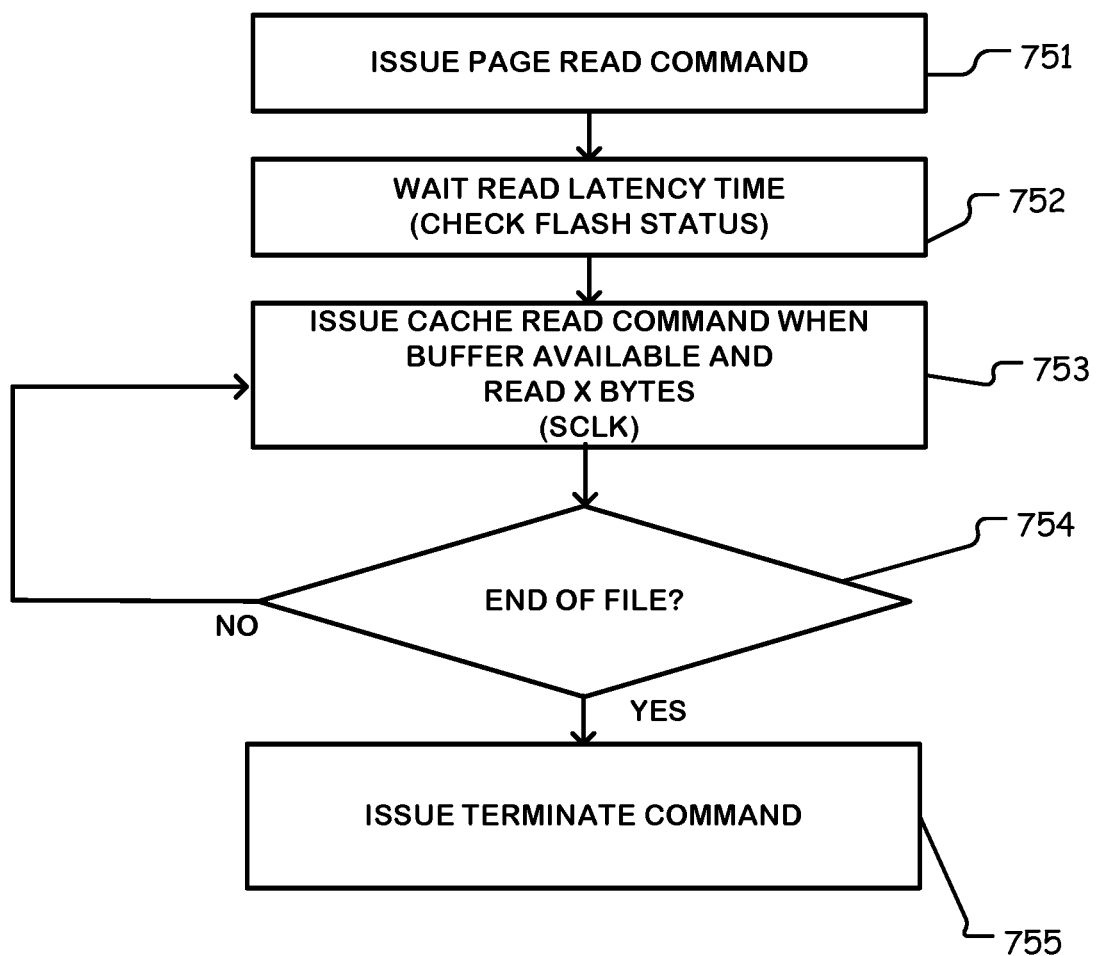
FIG. 7 is a flowchart of an algorithm executed by a host device for the continuous page read mode of FIG. 6.

FIG. 7 is a flowchart illustrating the control algorithm executed on the host for a continuous page read operation like that of FIG. 6. To read a file of data, the host issues a page read command which identifies a starting page address (751). The host waits a read latency time to allow for data of the starting page to be moved into the cache and become available for a cache read operation (752). The read latency can be determined using a timer on the host, or by using latency control on the memory device, such as the writing of status signals which the host can read to determine whether the memory device is ready to receive a cache read command. After waiting the latency time, the host issues a cache read command when its input/output buffer is available, and reads a data unit having a number of bytes determined by the host (753). The number of bytes can be determined by the number of clock cycles used in the data output phase between toggling of the chip select signal, as discussed above. After reading the data unit, the host determines whether the end of the file has been reached (754). If not, the algorithm loops back to step 753, and issues a next cache read command when the buffer is available. The starting address in the cache of the data unit to be read can be tracked using a counter or pointer on the memory device with the cache.

If, at step 754, the end of the file has been reached, then the host issues a terminate command (755).

The controller on the memory device can include a state machine or other logic circuits to execute operations that are complementary to this command sequence from the host, as discussed above in connection with FIGS. 5 and 6.

Figure 8:
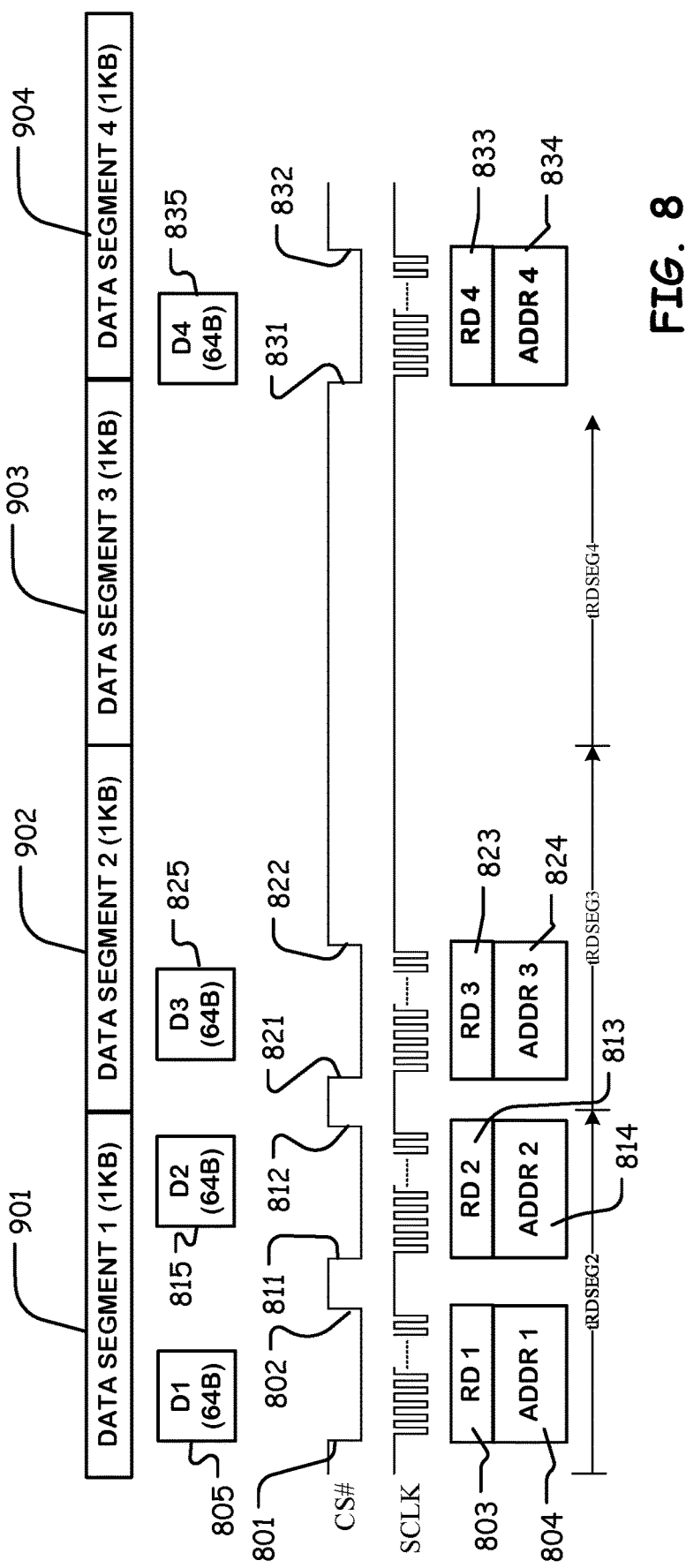
FIG. 8 is a heuristic diagram illustrating a continuous page read mode with random cache memory access.

FIG. 8 illustrates an alternative embodiment of the continuous page read operation using multiple cache read commands as described herein, where cache addresses provide for non-sequential access to parts of data segments in the cache, and optionally page addresses which feed the background continuous page read operation with addresses that can be non-sequential, are associated with the cache read commands. As illustrated, the cache on the memory device can include multiple cache blocks (i.e. separately accessible portions of cache memory) used alternatively to receive data segments (data to be read) from the memory and to output data from the data segments to the I/O on the device. FIG. 8 illustrates a sequence of data segments, including segments 901, 902, 903 and 904 loading in sequence cache blocks, including embodiments with two cache blocks operable in ping pong fashion, embodiments with with three or more cache blocks operation in a round robin fashion. In this example, each data segment comprises as a representative example 1 kB of data and each of the cache blocks may include at least 1 kB of memory space. In FIG. 8, as part of a continuous page read operation the memory device loads data segment 901 to a cache block from the page buffer, in response to a previous read command. The first cache read command 803 with an associated address 804 for a unit of data is included between toggling of the chip select signal at time 801, starting of the clock signal, and toggling of the chip select signal at time 802. The cache address identifies a data unit "D1" 805 to be read from the cache block holding the data segment 901. The next data unit "D2" 815 can be identified in a next cache read command 813 by an associated cache address 814 between the toggling of the chip select signal at times 811 and 812, and the running of the clock signal. The address 814 identifies a data unit "D2" 815 to be read from the cache block holding the data segment 901 (the same cache block as data unit D1), which is not necessarily sequential with the data unit D1 805. The next data unit "D3" 825 can be identified in a next cache read command 823 by an associated cache address 824 between the toggling of the chip select signal at times 821 and 822, and the running of the clock signal. The address 824 identifies a data unit "D3" 825 to be read from the cache block holding the data segment 902. As illustrated, data unit D3 begins at a non-zero offset from the start of data segment 902. So the cache read command 823 is issued by the host, and received at the memory, after a latency time tRDSEG2 required for data segment 2 to be loaded into the available cache block from the memory.

In this example, the next cache read command 833 and associated address 834 received between toggling of the chip select signal at time 831, starting of the clock signal, and toggling of the chip select signal at time 832 identify data unit "D4" 835 to be read from the cache block holding data segment 904, skipping data segment 903. Thus, the cache read command 833 is issued by the host after the combination of the latency time tRDSEG3 and latency time tRDSEG4, allowing time sufficient for data segment 4 to be loaded into the available cache block, after the data segment 3.

The host can issue cache read commands according to a desired sequence, which need not have sequential addresses. The flow chart executed by the host can be like that shown in FIG. 7, while the addresses associated with each of the cache read commands can be set according to the priority of use of the data in the file being read, or other factors within the host device control. The controller on the memory device can include a state machine or other logic circuits to execute operations that are complementary to this command sequence from the host, as discussed above. In this example, the cache addresses in both data D1 and data D2 are in the same segment from one cache block and the cache address of the data D3 is in the different segment in another cache block. There is no background timing constraint to read the data (data 1 and data 2) in the same segment, assuming it is in the cache at the time of the command. However, when the data segments is not yet in the cache block, the host needs to wait a latency time corresponding to the amount of time it takes to load the data segment including the addressed data from the memory to the data register and into the cache block. This may be the time for one segment to be loaded in the cache if the next data falls in the next segment in the read operation, or the time for more than one segment to be loaded in the cache if the next data (D4) falls in a segment later in the read operation than the next segment.

FIG. 8 also illustrates a command protocol, where the cache read commands can carry both page addresses and cache addresses. The cache read command may include the cache address only to support the random cache continuous read function, or the cache read command may include both the cache address and page address to support the random page continuous read operation with random cache read.

For continuous page read supporting non-sequential pages, a controller can be included on the memory device, responsive to the commands received at the input/output interface, to control memory operations including a continuous page read operation to output a stream of pages at the I/O interface. The continuous read operation includes responding to a series of commands, the series including a first command (continuous page read) to start the continuous page read operation, and one or more intra-stream commands (cache read) to move data from the cache to the interface. The first command includes a page address to initiate the continuous page read operation to load a page from the page address to the page buffer, move the page to an available cache block in the cache and load a next page from a next page address to the page buffer in sequence, wherein controller is configured to use one of a sequential address and a non-sequential address to provide the stream of pages as the next page address. The non-sequential page address is provided with a cache address for the cache read in embodiments with an intra-stream command in the one or more intra-stream commands to read data from the cache of a preceding page in the stream of pages. The sequential page address can be provided by an internal address counter, in cases in which the intra-stream command need not include a page address, or by the intra-stream command. A command can provide a cache address in this example, and all examples described herein, which includes a number of bits to identify addressed data units within the cache, or a combination page/cache address which includes page address bits as a higher order bits and cache address bits as lower order bits in a single address.

A continuous page read operation executed by the memory controller loads a first page segment 901 into an available cache block in the cache, and a second page segment into an available cache block in the cache in sequence. The second page segment 902 can reside on a different page than the first page segment. The protocol can include receiving a cache read command 803 with an associated page/cache address 804 with a cache address for a first data unit and a page address for a next page in the stream of pages, between the toggling of the chip select signal at times 801 and 802, and the running of the clock signal. The data unit 805 may comprise for example 64 bytes, starting at the cache address of page/cache address 804 having a length determined for example by the number of data output phase clock cycles. As illustrated, there may be another cache read command 813 with a page/cache address 814 that accesses segment 901. But command 813, which reads from the same data segment in the same cache block as the previous command 803, may be omitted in some sequences. After the second cache read command 813, or after one or more additional cache read commands in the same segment, a next read command 823 with an associated page/cache address 824 for a third data unit 825 is received between the toggling of the chip select signal at times 821 and 822. After the cache read command 823, in this example, a next read command 833 with an associated page/cache address 834 for a fourth data unit 835 is received between the toggling of the chip select signal at times 831 and 832. The page address in the next read command 833 may be non-sequential in a random continuous page read operation. A latency time interval may be required between a cache read command addressed to a first segment, and the starting of the cache read command addressed to a subsequent segment, to allow for loading of the data into the cache of the subsequent segment identified by the page/cache address (e.g. 834). The controller on the memory device can include a state machine or other logic circuits to execute operations that are complementary to this command sequence from the host, as discussed above.

In this example, the page/cache address can be read by the controller to shift the continuous page read operation randomly to different pages. This enables implementation of a random page continuous read operation like that described in commonly owned pending U.S. patent application Ser. No. 16/544,055 filed on 19 Aug. 2019, entitled Non-Sequential Page Continuous Read (US 2020/0142843), and U.S. patent application Ser. No. 16/533,463 filed on 6 Aug. 2019, entitled Fast Page Continuous Read (US 2020/0125443), which are incorporated by reference as if fully set forth herein.

Figure 9:
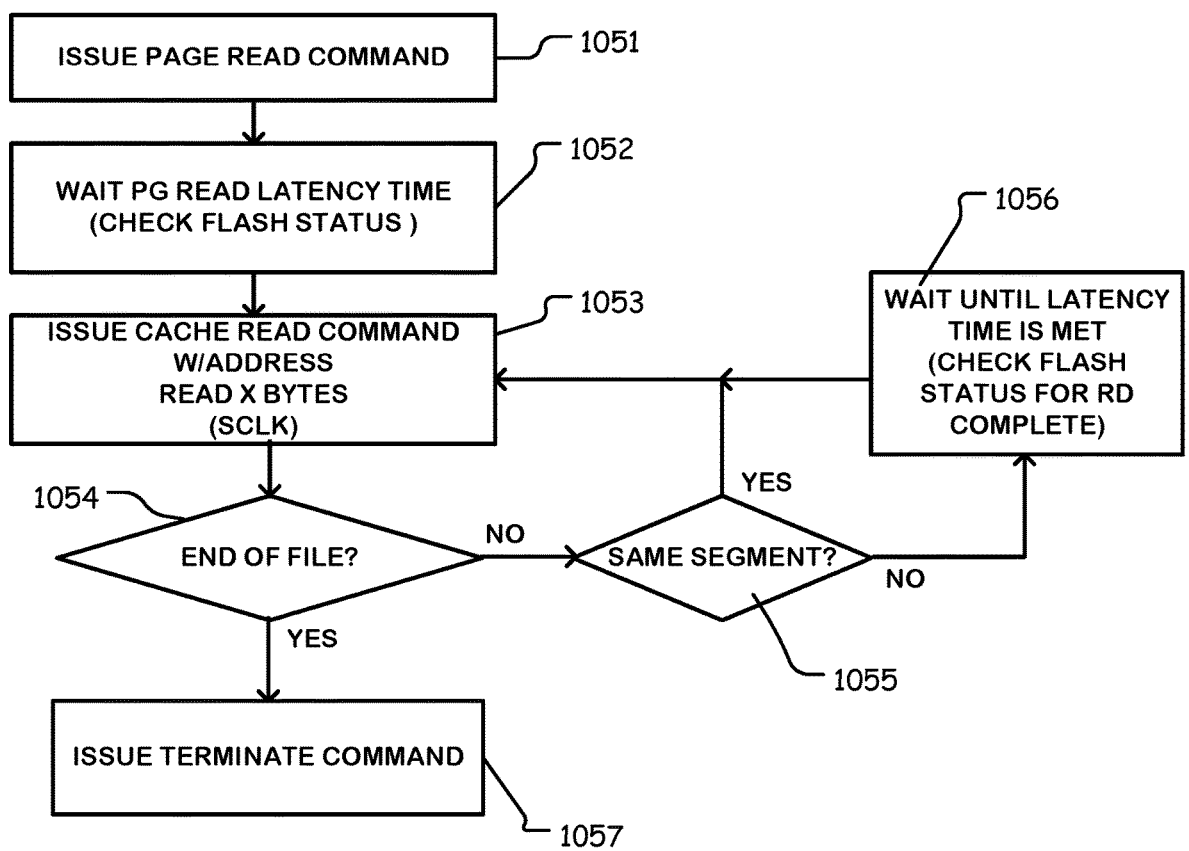
FIG. 9 is a flowchart of an algorithm executed by a host device for the continuous page read mode of FIG. 8.

FIG. 9 is a flowchart illustrating an algorithm executed on the host to perform a continuous page read operation, with random cache address capabilities like that shown in FIG. 8. In this example, the operation begins with the host issuing a page read command to read a file stored in the memory device (1051). After issuing the page read command, the host waits a page read latency time (e.g., tRDSEGx), or reads a status register on the memory device, such as a read complete status, indicating that the page identified in the page read command is ready in the cache memory for reading (1052). When ready, the host issues a cache read command including a cache address, and reads a unit of data having a length determined for example by the number of clock cycles, in this example, associated with the command. After reading the data, the host determines whether the end of the file is reached, or all of the data in the file which the host desires, has been read (1054). If not, then the host determines whether a next data unit to be read resides in the same cache block as the previous data unit (1055). If the next data unit is in the same segment, then the host loops to step 1053, and issues a next cache command. If the next data unit at step 1055 is in a different segment of the cache, or in a different page, the host waits a read latency time (for a page, a segment or multiple segments depending on the configuration and the address) or executes other latency control, such as reading a status register (1056). After the latency control, the host loops to step 1053 to issue the next cache read command. If at step 1054, the host is finished reading the data in this continuous read operation, the host issues a terminate command (1057).

Figure 10:
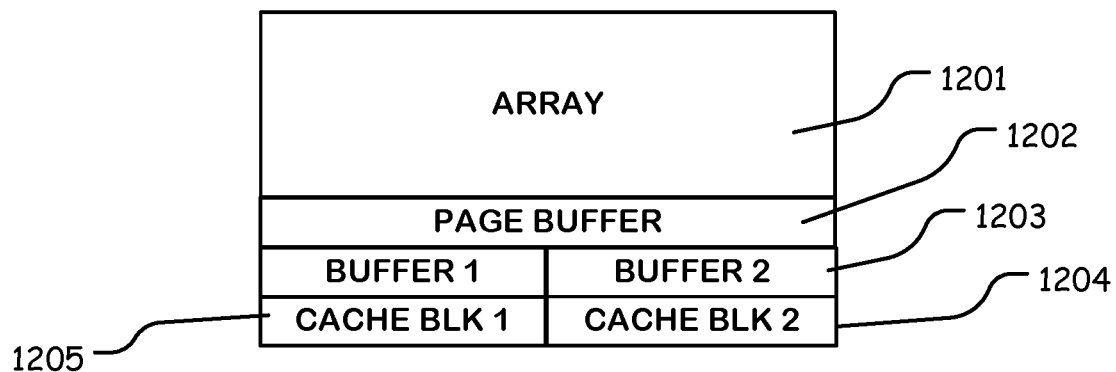
FIG. 10 illustrates a one array memory structure with two cache blocks for which a continuous read operations like that of FIG. 8 can be deployed.
Figure 11:
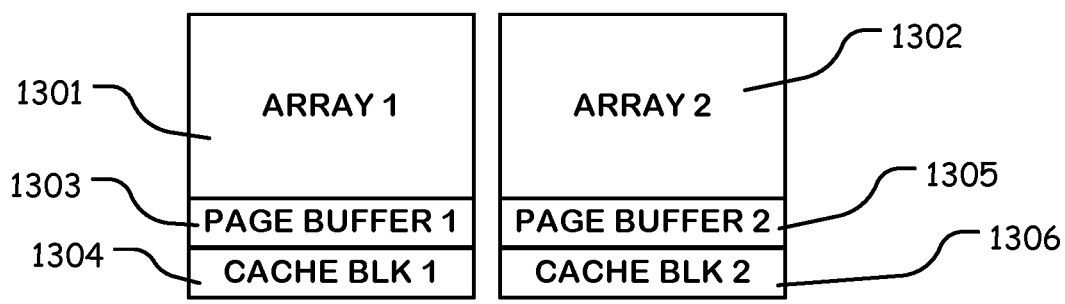
FIG. 11 illustrates a two array memory structure with two cache blocks for which a continuous read operations like that of FIG. 8 can be deployed.
Figure 12:
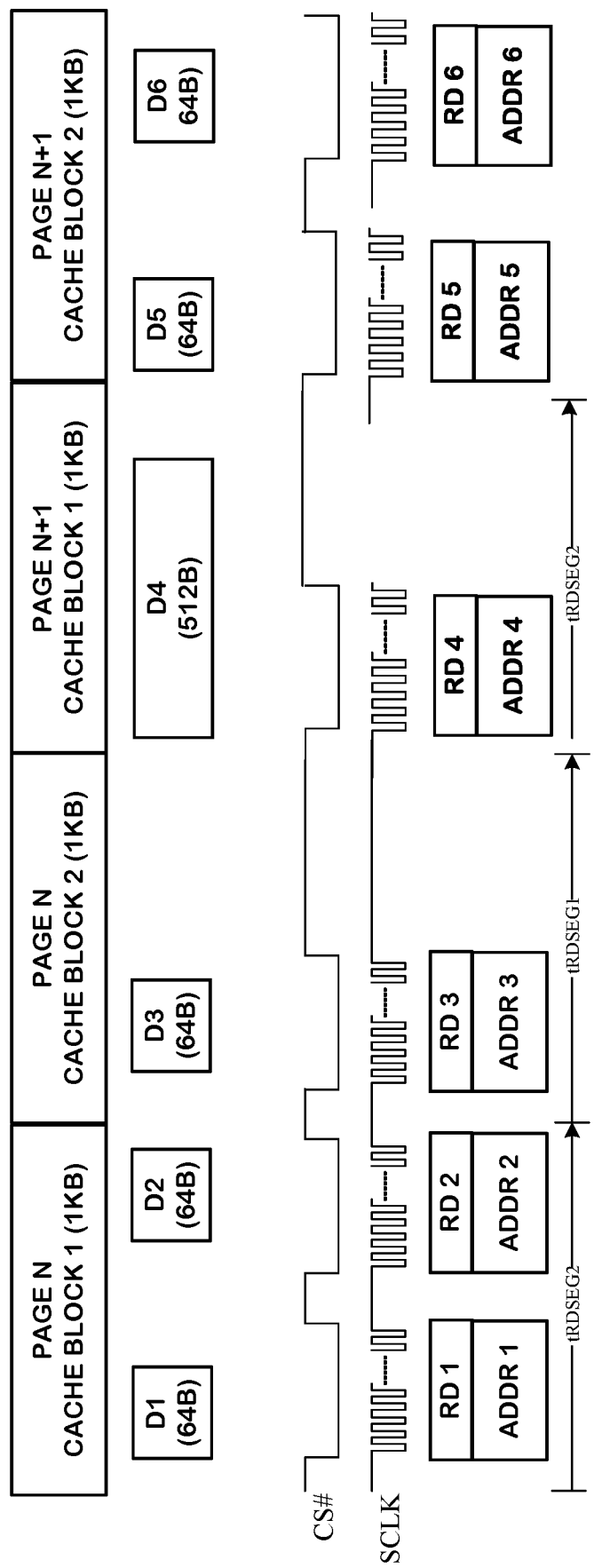
FIG. 12 is an example command sequence that can be executed using memory structures like those of FIGS. 10 and 11.

FIGS. 10 and 11 illustrate one array and two array memory structures with two cache blocks for which a continuous read operations like that of FIG. 8 can be deployed. FIG. 12 is an example command sequence that can be executed using memory structures like those of FIGS. 10 and 11.

In FIG. 10, a single memory array 1201 is implemented with a single page buffer 1202. Intermediate buffer 1 and intermediate buffer 2 in layer 1203 are disposed between the page buffer 1202 and a cache that includes a first cache block 1205 and a second is cache block 1204. For this configuration, the page size is equal to the size of the page buffer 1202. One cache block has a size equal to one half of the page size.

FIG. 11 illustrates an embodiment in which two memory arrays 1301, 1302 are deployed, each having a page buffer 1303, 1305 with a corresponding cache block 1304, 1306. For this configuration, the page size is two times the page buffer size, such that one page is equal to the size of the page buffer 1+the size of the page buffer 2. The size of the cache block remains one half of the page size.

FIG. 12 shows a read waveform for a continuous page read operation that can be applied using the memory structures of FIG. 10 and FIG. 11. In this flow, as cache block 1 from page N becomes available, the host issues a cache read command in coordination with the chip select signal and the serial clock, including an address for data D1. This address can include the cache address of byte zero of D1, and sequential bytes are output with the serial clock. At a subsequent time, the host in this example issues a second read command carrying an address for byte zero of data D2 in cache block 1. When the second cache block is loaded from page N, the host can issue a third read command carrying an address of the first byte in the cache of data D3 and so on has desired by the host process. In the continuous read operation, after a read segment latency allowing for loading of the page N+1, the host can issue a fourth read command carrying the address in cache block 1 of data D4. In this example, data D4 is illustrated as including 512 bytes, which are available on the I/O of the memory chip in response to the read command. After the second segment is loaded from page N+1, the host can issue subsequent read commands, such as a fifth read command for data D5 and a sixth read command for data D6.

For this case without page addressing, in some embodiments the host can only jump from cache block 1 to cache block 2, or from cache block 2 to cache block 1. It may not be allowed for the host to jump from cache block 1 in the page N, to cache block 1 in page N+1. The controller on the memory chip can move from one cache block to another in response to a cache address only in this example.

Figure 13:
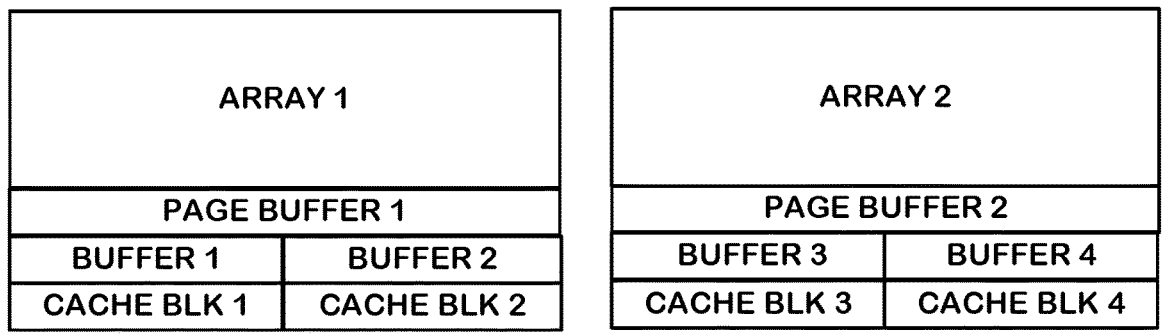
FIG. 13 illustrates a two array memory structure with four cache blocks for which a continuous read operations like that of FIG. 8 can be deployed.
Figure 14:
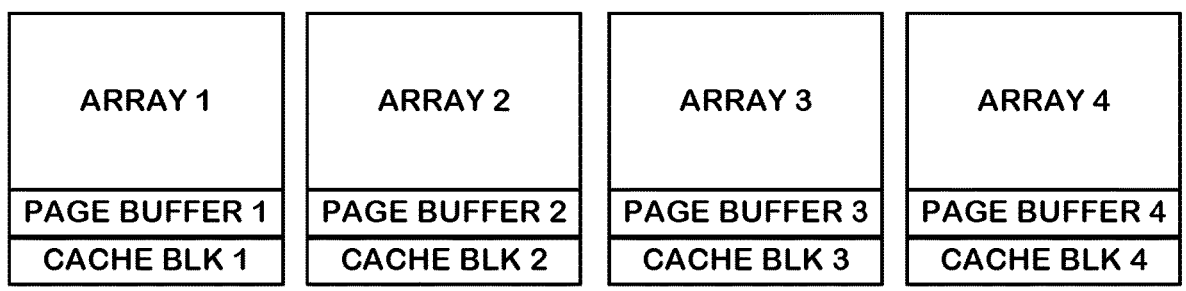
FIG. 14 illustrates a four array memory structure with four cache blocks for which a continuous read operations like that of FIG. 8 can be deployed.
Figure 15:
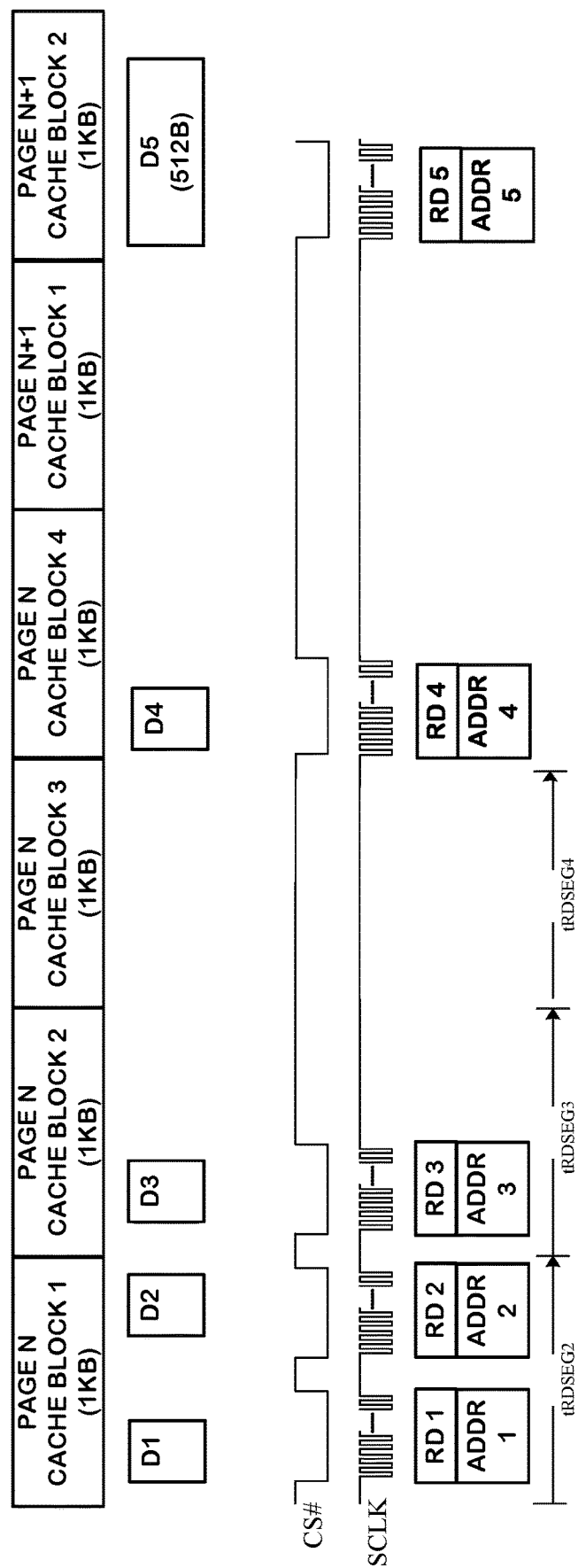
FIG. 15 is an example command sequence that can be executed using memory structures like those of FIGS. 13 and 14.

FIGS. 13 and 14 illustrate two array and four array memory structures with four cache blocks for which a continuous read operations like that of FIG. 8 can be deployed. The drawings are self-explanatory. FIG. 15 is an example command sequence that can be executed using memory structures like those of FIGS. 13 and 14.

In the two array memory structure of FIG. 13, the page size is equal to two times the page buffer size (page buffer 1+page buffer 2). One cache block holds one fourth of a page size. In the four array memory structure of FIG. 14, the page size is equal to four times the page buffer size (page buffer 1+page buffer 2+page buffer 3+page buffer 4). The cache block size is one-fourth the page size.

An example read operation as illustrated in FIG. 15 for implementation including four cache blocks like those of FIGS. 13 and 14. In a continuous page read operation, after cache block 1 is loaded, the host can issue a first read command carrying an address for the first byte of data D1. Also, the host can issue a second read command carrying an address for the first byte of data D2 within the first cache block. After the second cache block is loaded, the host can issue a third read command carrying an address of the first byte of data D3 in the second cache block. In an example operation, the host can issue a fourth read command which is addressed to data D4 in the fourth cache block, skipping the third cache block. Thereafter, the host may issue a fifth read command address to data D5 in the following page N+1 after it is loaded into the second cache block of the following page. In the sequence, the controller on the memory chip can jump from one segment to another in response to the cache address only in the read command. In this memory structure, the host can be configured to issue read sequences that jump from cache block to cache block, skipping zero, one or two blocks. For example, the read sequence may skip from cache block 1 to cache block 4 for data in a single page, skipping cache blocks 2 and 3. Also, the read sequence may skip from cache block 2 to cache block 1, for data in a next page, or segment 3 to cache block 2, for data in a next page, segment 4 to cache block 3, for data in a next page.

These examples of memory structures and read operations are examples of a wide a range of implementations available in embodiments of technology described herein.

Figure 16:
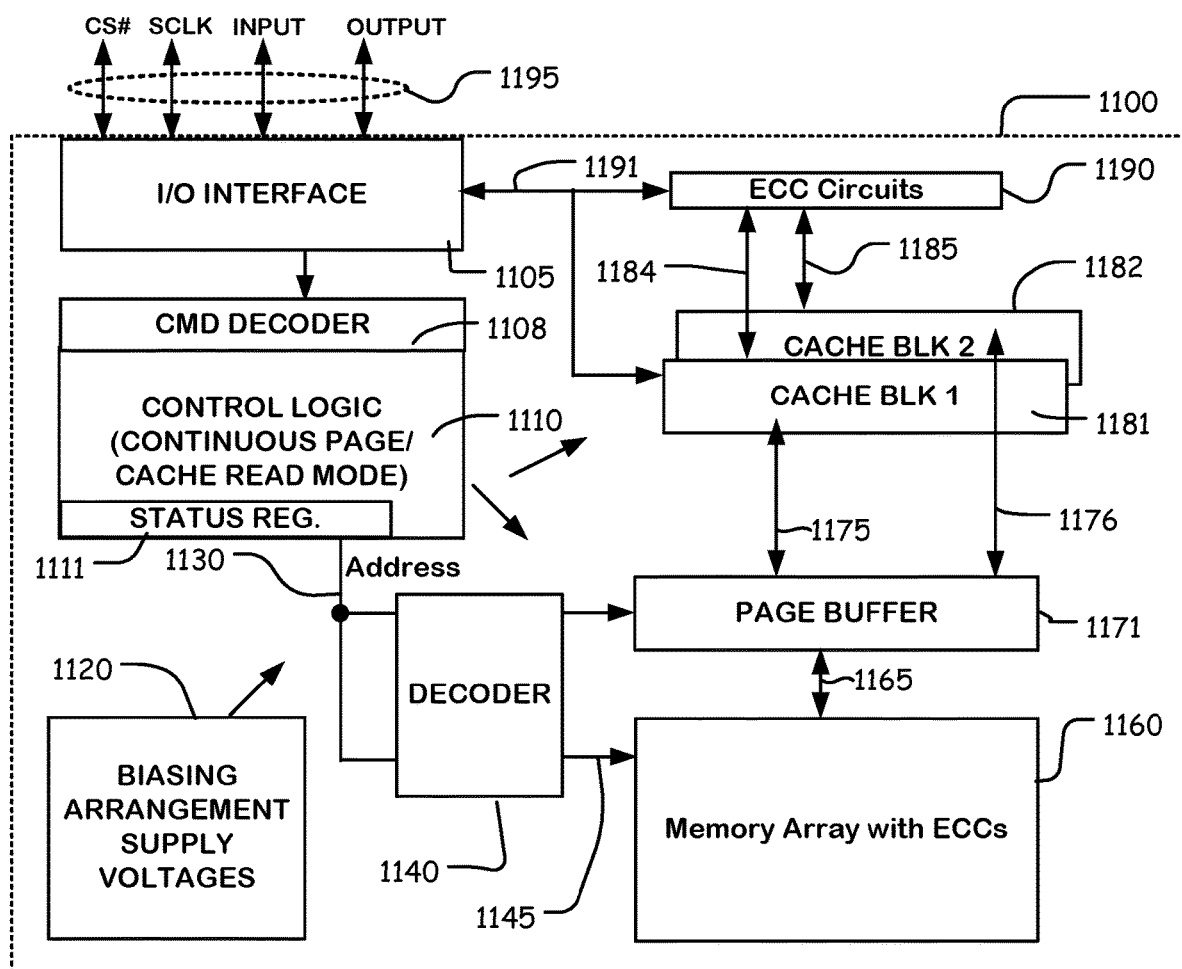
FIG. 16 is a block diagram of an integrated circuit memory device with a continuous page read mode with multiple cache read commands as described herein.

FIG. 16 is a simplified chip block diagram of an integrated circuit memory device according to an embodiment. The integrated circuit memory device 1100 includes a memory array 1160 that stores data with ECCs, such as a NAND flash array, on a single integrated circuit substrate. Memory devices as described herein can be implemented using multichip modules, stacked chips and other configurations as well.

Control logic 1110 with a command decoder 1108, on the integrated circuit memory device 1100, includes logic, such as a state machine, responsive to received commands to execute continuous read operations, including one or more of the operations described herein with reference to FIGS. 5, 6, 8, 12 and 15. The control logic 1110 can include a status register 1111. The control logic 1110 outputs control signals, represented by arrows on the diagram, and addresses on bus 1130. The addresses applied on bus 1130 can include for example outputs of an address counter in the control logic 1110, or addresses carried in received commands.

A decoder 1140 is coupled to a plurality of word lines 1145, and arranged along rows in the memory array with ECCs 1160, and to a page buffer 1171. The page buffer 1171 is coupled to a plurality of bit lines 1165 arranged along columns in the memory array with ECCs 1160 for reading data from and writing data to the memory array with ECCs 1160.

The page buffer 1171 can include one or more storage elements used as a data register for each bit line. The decoder 1140 can select and couple specific memory cells in the memory array with ECCs 1160 via respective connecting bit lines to the page buffer 1171. The page buffer 1171 can store data that is written to or read from these specific memory cells in parallel. The page buffer 1171 can have a page width for pages including thousands of bytes, such as 2K bytes or 4K bytes, or more, plus spare bytes including associated ECC codes. One page can include a plurality of ECC chunks, wherein ECC chunks include a segment of data and an associated ECC code (i.e. having been computed for ECC over the segment of data). In embodiments, each page includes 2 ECC chunks having an ECC width equal to one half page, plus the size of the associated ECC codes. In some embodiments, there may be more than 2 ECC chunks per page.

A buffer memory structure in this embodiment includes a second buffer level, including two parts designated cache BLOCK 1 1181 and cache BLOCK 2 1182, in this example, where each part of the second buffer level can store a part, such as one half, of the contents of the page buffer, where the part of the contents of the page buffer preferably include one or more ECC chunks. The size of cache blocks 1181 and 1182 is not necessary smaller than one page. In one embodiment, the cache size can be the same as the page size, that is the size of one cache block 1181 can be one page. Also, in some embodiments, the size of one cache block 1181 can be more than one page, such as two or more pages per cache block. In cases of cache block sizes of one page or more, the host can randomly read inside one page because each segment of the cache is at least one page. Also, each part of the second buffer level can be read from and written to independently.

In some embodiments, the cache blocks (e.g., BLOCK 1, BLOCK 2) can be implemented using dual port or multi-port memory technology, allowing independent reads and writes to different addresses, or can be implemented using multiple banks of memory, having separate address decoding and read-out circuits. Other embodiments can include three-level buffer structures including the page buffer 1171 and two additional buffer levels. Also, other arrangements of buffer memory structures in the data path circuits between the page buffer and the interface can be implemented.

The page buffer 1171 is coupled with the memory array with ECCs 1160 via X data lines where X is at least a page plus ECC codes width, and with the second-level buffers (BLOCK 1, BLOCK 2) of the buffer structure, via buses 1175, 1176 of Y bits each, where the buses 1175, 1176 can have a width equal to a half width of the page buffer 1171, or widths equal to the width of the page buffer in some cases having large cache blocks sizes. The second-level buffers BLOCK 1, BLOCK 2 can each be implemented with a cache memory using SRAM (static random access memory) memory structures for example, that has a one row by multiple column architecture. For instance, a page can include 2048 bytes+spare bytes including ECC codes, and BLOCK 1 can have one row with 1024 bytes (+spare bytes including ECC codes) columns or a width of 1024 bytes+ spare bytes including ECC codes. The buffers BLOCK 1 and BLOCK 2 can be operated so that the page of data in the page buffer can be transferred to the buffers BLOCK 1 and BLOCK 2 in parallel, and in parallel using one buffer memory cycle. Also, the buffers BLOCK 1 and BLOCK 2 can be operated so that the one part of the page of data in the page buffer can be transferred to each one of the buffers BLOCK 1 and BLOCK 2 in parallel, allowing the transfer of a first part of the page to a first part (e.g. BLOCK 1) of the second buffer level, and the transfer of a second part of the page to a second part (e.g. BLOCK 2) of the second buffer level in the same or different buffer memory cycles.

Third-level buffers can also be implemented with a cache memory, using SRAM (static random access memory) memory structures for example, that has a one row by multiple column architecture. For instance, a page can include 2048 bytes+spare bytes including ECC codes, and a third-level BLOCK 1 can have one row with 1024 bytes (+spare bytes including ECC codes) columns or a width of 1024 bytes+spare bytes including ECC codes. The third-level buffers can be operated so that the page of data in the page buffer can be transferred to the third-level buffers in parallel, using one buffer memory cycle. Also, the third-level buffers can be operated so that the one part of the page of data in the second-level buffer can be transferred to each one of the third-level buffers in parallel, allowing the transfer of a first part of the page to a first part of the third buffer level, and the transfer of a second part of the page to a second part of the third buffer level in the same or different buffer memory cycles.

Error checking and correction ECC circuits 1190 are coupled to the buffer memory structure (1181, 1182 and three level embodiments) by data bus 1184 and data bus 1185. The data buses 1184 and 1185 can have a bus width less than an ECC chunk, such as one byte or one word, and are used by the ECC circuits 1190 to cycle through ECC chunks to perform ECC operations of error checking and error correction (e.g. syndrome calculation, key calculation, Chien search). The ECC circuits are coupled by data bus 1191 to the buffer memory structure (1181, 1182) for movement of data back and forth as necessary.

An I/O interface 1105 which can include an I/O buffer comprising a byte-wide or multiple byte-wide transmit register or FIFO is coupled to the ECC circuits and to the buffer memory structure (1181. 1182) by data bus 1191.

Input/output data and control signals are moved among the interface 1105, the command decoder 1108 and the control logic 1110, and input/output ports 1195 on the integrated circuit memory device 1100 or other data sources internal or external to the integrated circuit memory device 1100. In some embodiments, the I/O ports 1195 can connect to on-chip host circuits, such as a general purpose processor or special purpose application circuitry, or a combination of modules providing system-on-a-chip functionality supported by the memory array with ECCs 1160.

In one embodiment, the interface 1105 is a serial interface including a set of I/O ports 1195 through which commands, addresses and data are communicated. The serial interface can be based on or compliant with a Serial Peripheral Interface (SPI) bus specification in which the command channel shares the I/O pins used by address and data. For example, the integrated circuit memory device 1100 can include input/output ports using pins for receiving and transmitting SPI bus signals. One pin can be connected to an input data line carrying serial input data/address signal SI, usable for commands as well. Another pin, or multiple other pins, can be connected to an output data line or output data lines carrying serial output data signals SO. Another pin can be connected to a clock line carrying a serial clock signal SCLK. Yet another pin can be connected to a control line carrying chip-enable or chip-select signal CS #. Other types of interfaces, including parallel interfaces can be used as well. The I/O ports 1195 on a particular integrated circuit memory device 1100 can be configured to provide output data with an I/O data width, which can be, for some examples, 1, 4, 8, 16, 32 or more bits in parallel per interface clock (e.g. SCLK) cycle. The I/O interface 1105 can include a FIFO buffer, a shift register buffer or other supporting circuits along with a transmitter for transmitting data received at the interface on ports at a port clock rate, such as an SCLK rate for an SPI interface. In examples described herein, the SCLK referred to in the Figures can be supplied externally from the host. In other examples, the SCLK can be generated internally.

In the example shown in FIG. 16, control logic 1110, using a bias arrangement state machine, controls the application of a bias arrangement supply voltage generated or provided through the voltage supply or supplies in block 1120, such as read, program and erase voltages including page read to transfer data from a page in the memory array to the page buffer. The control logic 1110 is coupled to the multi-level buffer structure, the ECC circuits 1190, and the memory array with ECCs 1160.

The control logic 1110 and command decoder 1108 constitute a controller which can be implemented using special purpose logic circuitry including state machines and supporting logic. In alternative embodiments, the control logic comprises a general-purpose processor, which can be implemented on the same integrated circuit, which executes a computer program to control the operations of the device. In yet other embodiments, a combination of special-purpose logic circuitry and a general purpose processor can be utilized for implementation of the control logic.

The command decoder 1108 and control logic 1110 of the controller are configured to execute a continuous page read operation using multiple cache read commands. In embodiments described herein, the controller is responsive to the commands received at the input/output interface, to control memory operations including a continuous page read operation to output a stream of pages at the I/O interface.

Figure 17:
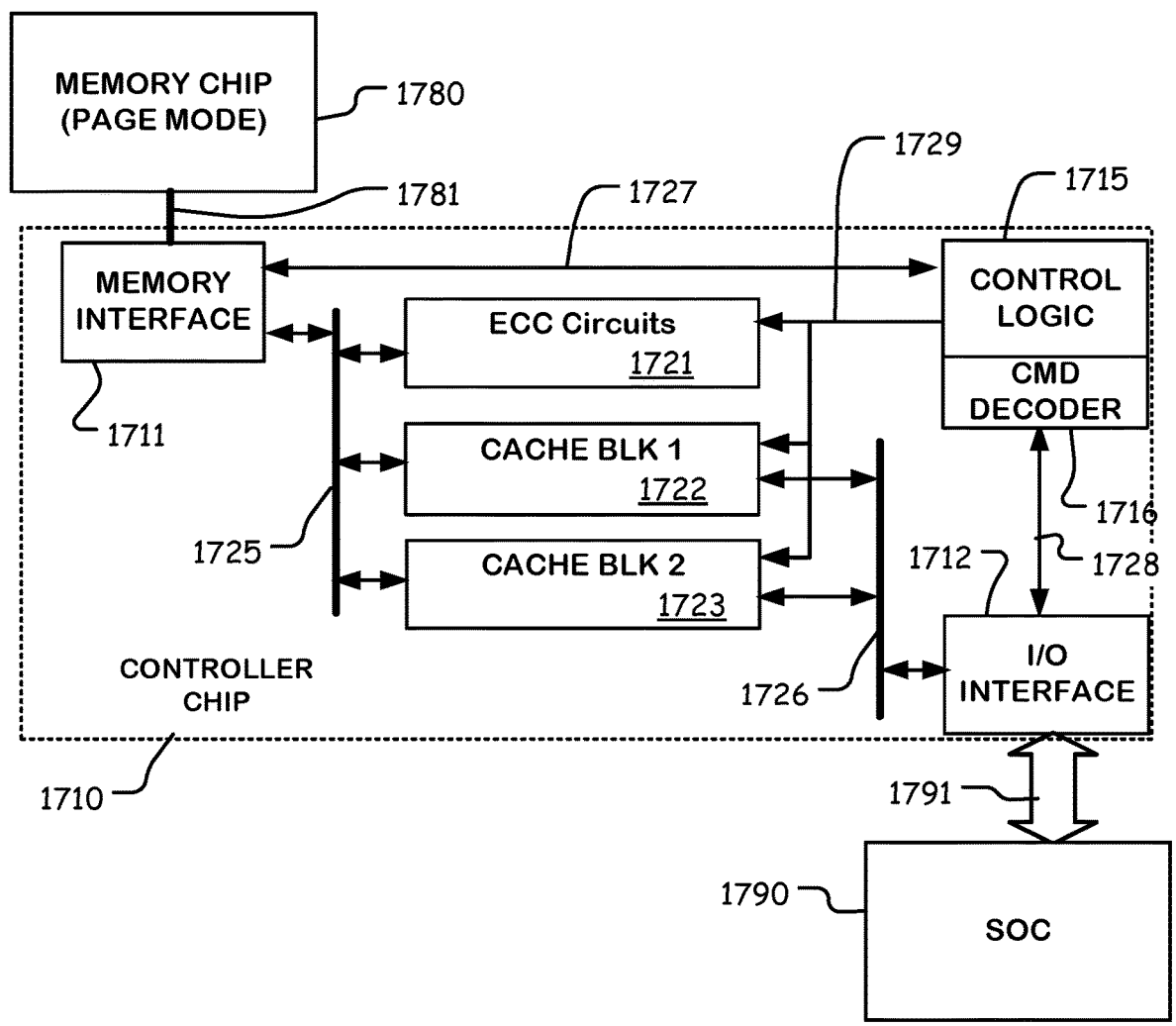
FIG. 17 is a block diagram of an alternative implementation including a memory controller with cache memory with continuous page read mode operations.

FIG. 17 illustrates a configuration wherein the memory device includes a control chip 1710 and a memory chip 1780 configured for communication with a host, such an SOC integrated circuit. The control chip 1710 and memory chip 1780 can be implemented in a multi-chip package or multi-chip module. In some embodiments, the SOC integrated circuit 1790, the control chip 1710 and memory chip 1780 can be implemented in a multi-chip package or multi-chip module.

In some implementations, a memory device may be implemented on an integrated circuit in which the cache memory segments are constrained by limitations of space on the chip, interconnect limitations and performance limitations. It is desirable in some cases for the cache memory to have first and second segments that are at least as large as one page. This allows a host to execute random cache reads inside a single page in a single cache block. Random cache reads in in a single segment can avoid any timing limitations that may arise in switching between cache blocks.

As illustrated in FIG. 17, the memory device can comprise more than one integrated circuit chip. In this example, the memory device includes a control chip 1710 having a memory interface 1711, which is connected to the memory chip 1780 by links 1781. The control chip 1710 includes an I/O Interface 1712 connected by bus 1791 to the host SOC 1790. The I/O interface 1712 can in some embodiments be configured in the same manner as the I/O interface 1105 is the embodiment described with reference to FIG. 16. The control chip 1710 in this example includes ECC circuits 1721, cache block 1 (1722) and cache block 2 (1723). Also, the control chip 1710 includes control logic 1715 with a command decoder 1716. The memory interface 1711 is connected by an internal bus 1725 to the ECC circuits 1721, cache block 1 (1722) and cache block 2 (1723). Also, the memory interface 1711 is connected by the link 1727 to the control logic 1715. The I/O Interface 1712 is connected by internal bus 1726 to the cache block 1 (1722) and cache block 2 (1723), in this example. Also, the I/O interface 1712 is connected by the link 1728 to the command decoder 1716 and control logic 1715, by which commands are received from the host SOC 1790, including cache read commands, page read commands including continuous page read commands and continuous random page read commands, and so on. Also, the control logic 1715 is connect by the internal bus 1729 to the ECC circuits 1721, cache block 1 (1722) and cache block 2 (1723). The control logic 315 composes memory chip commands by which it controls memory operations, causing the memory chip 1780 to execute the memory operations needed to support transfer of data from the memory array on the memory chip 1780, such as through a page buffer or other buffer structure, to the cache memory segments 1722 and 1723.

In the configuration of FIG. 17, all of the operations described above can be implemented, which can take advantage of the use of larger cache block sizes, or faster or more efficient host interfaces. In some embodiments, cache block 1 (1722) and cache block 2 (1723) are large enough to hold one page, or more than one page. In other embodiments, the cache block sizes for cache block 1 (1722) and cache block 2 (1723) may be less than one page. In other embodiments, more than two cache blocks may be deployed.

Other implementations of the methods executed by the host as described in FIGS. 7 and 9, can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

Any data structures and code described or referenced above are stored according to many implementations on a computer-readable storage medium, which may be any device or medium that can store code and/or data for use by a computer system. This includes, but is not limited to, volatile memory, non-volatile memory, application-specific integrated circuits (ASICs), field-programmable gate arrays (FPGAs), magnetic and optical storage devices such as disk drives, magnetic tape, CDs (compact discs), DVDs (digital versatile discs or digital video discs), or other media capable of storing computer-readable media now known or later developed.

A byte is a basic storage unit used in many integrated circuit logic and memory circuits, and consists of eight bits. Basic storage unit can have other sizes, including for example one bit, two bits, four bits, 16 bits and so on. Thus, examples described herein utilizing the term byte, apply generally to circuits using different sizes of storage units, as would be described by replacing the term byte or set of bytes, with storage unit or set of storage units. Also, in some embodiments different sizes of storage units can be used in a single command sequence, such as one or more four bit storage units combined with eight bit storage units.

A number of flowcharts illustrating logic executed by a memory controller or by memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory device having a memory array, a data register operatively coupled to the memory array, a cache operatively coupled to the data register, and an input/output interface operatively coupled to the cache, the method comprising:
   executing a continuous read operation to sequentially load data segments to the data register and to move the data segments from the data register to the cache, in response to a read command;
   executing a cache read operation to move data from the cache to the input/output interface in response to a current cache read command and stalling movement of data from the cache to the input/output interface until a next cache read command in a sequence of cache read commands, wherein the data moved to the input/output interface in the cache read operation has a length determined by a number of clock cycles of a clock signal, and the stalling includes stopping the clock signal; and
   terminating the continuous read operation.

2. The method of claim 1, wherein the cache read command includes a cache address, and selecting the data moved from the cache in dependence on the cache address.

3. The method of claim 1, wherein the cache includes a first cache block and a second cache block, and the continuous read operation includes loading data from the data register to the first cache block while the cache read operation moves data from the second cache block to the input/output interface, and loading data from the data register to the second cache block while the cache read operation moves data from the first cache block to the input/output interface.

4. The method of claim 3, wherein the cache read command includes a page address and a cache address.

5. The method of claim 4, wherein the address in the cache read command can indicate data to be selected from one of the first and second cache blocks different from the one of the first and second cache blocks in a cache read command address in an immediately preceding cache read command.

6. The method of claim 1, wherein the cache read command includes a page address and the continuous read operation selects a next page for a sequential load of pages in dependence on the page address in the cache read command.

7. A method of reading a file from a memory device having a memory array, a data register operatively coupled to the memory array, a cache operatively coupled to the data register, and an input/output interface operatively coupled to the cache, the method comprising:
   issuing a read command to initiate a continuous read operation on the memory device to sequentially load segments of the file to the data register and move the segments from the data register to the cache;
   issuing a current cache read command to initiate a cache read operation to include reading data from the cache, loading the data in a buffer, and stalling movement of data from the cache to the buffer until a next cache read command, in coordination with the continuous read operation, and issuing the next cache read command in dependence on availability of memory space in the buffer, and continuing to issue cache read commands in a sequence to read the file, wherein the data moved from the cache to the buffer in the cache read operation has a length determined by a number of clock cycles of a clock signal, and wherein movement of data from the cache to the buffer is stalled in response to a stopping of the clock signal; and
   issuing a termination signal to terminate the continuous read operation.

8. The method of claim 7, wherein the cache read command includes a cache address, and selecting the data read from the cache in dependence on the cache address.

9. The method of claim 7, wherein the cache includes a first cache block and a second cache block, and the continuous read operation includes loading data from the data register to the first cache block while the cache read operation moves data from the second cache block to the input/output interface, and loading data from the data register to the second cache block while the cache read operation moves data from the first cache block to the input/output interface.

10. The method of claim 7, wherein the cache read command includes a page address and a cache address.

11. The method of claim 7, wherein the cache read command includes a page address and the continuous read operation selects a next page for a sequential load of pages in dependence on the page address in the cache read command.

12. The method of claim 7, wherein:
the cache includes a first cache block and a second cache block;
a first cache read command includes a first cache address identifying a corresponding one of the first cache block or the second cache block, from which first data is to be moved to the buffer;
a second cache read command includes a second cache address identifying a corresponding one of the first cache block or the second cache block, from which second data is to be moved to the buffer;
the first cache read command and the second cache read command are two consecutive cache read commands; and
the first cache address identifying the corresponding one of the first cache block or the second cache block is different from the second cache address identifying the corresponding one of the first cache block or the second cache block, in response to the first cache read command and the second cache read command being two consecutive cache read commands.

13. A method for operating a memory device having a memory array, a data register operatively coupled to the memory array, a cache operatively coupled to the data register, and an input/output interface operatively coupled to the cache, the cache including a first cache block and a second cache block, the method comprising:
executing a continuous read operation to sequentially load data segments to the data register and move the data segments from the data register to the cache, in response to a read command;
executing a cache read operation to move data from the cache to the input/output interface in response to a current cache read command, wherein the data moved to the input/output interface in the cache read operation has a length determined by a number of clock cycles of a clock signal; and
executing, during the cache read operation, stalling movement of data from the cache to the input/output interface by stopping the clock signal, until a next cache read command in a sequence of cache read commands is received.

14. The method of claim 13, wherein the cache read command includes a cache address, and selecting the data moved from the cache in dependence on the cache address.

15. The method of claim 13, wherein the cache includes a first cache block and a second cache block, and the continuous read operation includes loading data from the data register to the first cache block while the cache read operation moves data from the second cache block to the input/output interface, and loading data from the data register to the second cache block while the cache read operation moves data from the first cache block to the input/output interface.

16. The method of claim 13, wherein the cache read command includes a page address and a cache address.

17. The method of claim 16, wherein the address in the cache read command can indicate data to be selected from one of the first and second cache blocks different from the one of the first and second cache blocks in a cache read command address in an immediately preceding cache read command.

18. The method of claim 13, wherein the cache read command includes a page address and the continuous read operation selects a next page for a sequential load of pages in dependence on the page address in the cache read command.

19. A memory device, comprising:
a memory array;
a data register operatively coupled to the memory array;
a cache operatively coupled to the data register;
an input/output interface operatively coupled to the cache; and
a controller responsive to commands and addresses received at the input/output interface, including logic circuits to control memory operations including i) a continuous read operation to output a stream of data segments from the memory array to the data register, and from the data register to the cache, and ii) a cache read operation to output data from the cache to the input/output interface, wherein the data output to the input/output interface in the cache read operation has a length determined by a number of clock cycles of a clock signal, and iii) stalling movement of the data from the cache to the input/output interface by stopping the clock signal, until a next cache read command in a sequence of cache read commands is received.

* * * * *